US012585200B2

(12) United States Patent
Hill et al.

(10) Patent No.: US 12,585,200 B2
(45) Date of Patent: *Mar. 24, 2026

(54) IMAGING OVERLAY WITH MUTUALLY COHERENT OBLIQUE ILLUMINATION

(71) Applicant: KLA Corporation, Milpitas, CA (US)

(72) Inventors: Andrew V. Hill, Sunriver, OR (US);
Vladimir Levinski, Migdal HaEmek
(IL); Daria Negri, Nesher (IL); **Amnon
Manassen, Haifa (IL); Yonatan
Vaknin**, Yoqneam Llit (IL)

(73) Assignee: KLA Corporation, Milpitas, CA (US)

( * ) Notice: Subject to any disclaimer, the term of this
patent is extended or adjusted under 35
U.S.C. 154(b) by 0 days.

This patent is subject to a terminal dis-
claimer.

(21) Appl. No.: 18/742,869

(22) Filed: Jun. 13, 2024

(65) Prior Publication Data

US 2024/0329543 A1 Oct. 3, 2024

Related U.S. Application Data

(63) Continuation of application No. 17/863,216, filed on
Jul. 12, 2022, now Pat. No. 12,032,300.
(Continued)

(51) Int. Cl.
*G03F 7/00* (2006.01)
*G01B 11/27* (2006.01)

(52) U.S. Cl.
CPC ........ *G03F 7/70633* (2013.01); *G01B 11/272*
(2013.01); *G03F 7/70683* (2013.01); *G03F
7/706849* (2023.05); *G03F 7/706851*
(2023.05)

(58) Field of Classification Search
CPC ... G03F 7/705; G03F 7/70605–706851; G03F
7/70633; G03F 7/706849;
(Continued)

(56) References Cited

U.S. PATENT DOCUMENTS

| 4,947,413 A | 8/1990 | Jewell et al. |
| 5,216,257 A | 6/1993 | Brueck et al. |
| | (Continued) | |

FOREIGN PATENT DOCUMENTS

| JP | 10214765 A | 11/1998 |
| JP | 2001093820 A | 4/2001 |
| | (Continued) | |

OTHER PUBLICATIONS

Adel, Mike et al., "Diffraction order control in overlay metrology:
a review of the roadmap options," Proc. SPIE. 6922, Metrology,
Inspection, and Process Control for Microlithography XXII, 692202
(2008).
(Continued)

*Primary Examiner* — Christina A Riddle
(74) *Attorney, Agent, or Firm* — Suiter Swantz IP

(57) ABSTRACT

An overlay metrology system may include illumination
sources configured to generate one or more pairs of mutually
coherent illumination beams and illumination optics to
direct the pairs of illumination beams to an overlay target at
common altitude incidence angles and symmetrically
opposed azimuthal incidence angles, where the overlay
target includes two or more grating structures distributed
along one or more measurement directions. The system may
further include imaging optics to image the overlay target
onto detectors when implementing the metrology recipe,
where an image of a particular one of the two or more
grating structures includes a sinusoidal interference pattern
generated exclusively with a single non-zero diffraction
order of light from each of the illumination beams within the
particular one of the pairs of illumination beams. The system
may further include a controller to determine overlay mea-
surements based on images of the overlay target.

33 Claims, 13 Drawing Sheets

Related U.S. Application Data

(60) Provisional application No. 63/309,715, filed on Feb. 14, 2022.

(58) Field of Classification Search
CPC ................. G03F 7/706851; G03F 7/70; G03F 7/70483–70541; G03F 9/70; G03F 9/7003; G03F 9/7019; G03F 9/7023; G03F 9/7065; G03F 9/7069; G03F 9/7073–7084; G03F 9/7092; G01B 11/272; G01N 21/95; G01N 21/9501; G01N 21/956
USPC ..... 355/18, 30, 52–55, 67–77; 356/399–401, 356/614–624
See application file for complete search history.

(56) References Cited

U.S. PATENT DOCUMENTS

| | | | |
|---|---|---|---|
| 5,414,514 | A | 5/1995 | Smith et al. |
| 5,808,731 | A | 9/1998 | Kirk |
| 5,895,735 | A | 4/1999 | Yoon |
| 5,914,204 | A | 6/1999 | Lee |
| 6,958,819 | B1 | 10/2005 | Heaton et al. |
| 7,247,843 | B1 | 7/2007 | Moon |
| 7,440,105 | B2 | 10/2008 | Adel et al. |
| 7,602,491 | B2 | 10/2009 | Kandel et al. |
| 9,123,649 | B1 | 9/2015 | Manassen et al. |
| 9,864,209 | B2 | 1/2018 | Levinski et al. |
| 10,197,389 | B2 | 2/2019 | Levinski et al. |
| 10,488,768 | B2 | 11/2019 | Auer et al. |
| 10,585,357 | B2 | 3/2020 | Schaar et al. |
| 10,824,079 | B2 | 11/2020 | Lubashevsky et al. |
| 11,073,768 | B2 | 7/2021 | Hill et al. |
| 11,164,307 | B1 | 11/2021 | Feler et al. |
| 11,300,524 | B1 | 4/2022 | Hill et al. |
| 11,378,394 | B1 | 7/2022 | Paskover et al. |
| 11,409,205 | B2 | 8/2022 | Gdor et al. |
| 11,428,642 | B2 | 8/2022 | Hill et al. |
| 11,796,925 | B2 | 10/2023 | Lubashevsky et al. |
| 12,032,300 | B2 * | 7/2024 | Hill ...................... G01B 11/272 |
| 2001/0021477 | A1 | 9/2001 | Dirksen et al. |
| 2002/0080364 | A1 | 6/2002 | Monshouwer et al. |
| 2004/0169861 | A1 | 9/2004 | Mieher et al. |
| 2005/0195398 | A1 | 9/2005 | Adel et al. |
| 2007/0077503 | A1 | 4/2007 | Yoo |
| 2007/0234786 | A1 | 10/2007 | Moon |
| 2007/0242272 | A1 | 10/2007 | Suehira et al. |
| 2007/0279630 | A1 | 12/2007 | Kandel et al. |
| 2008/0065339 | A1 | 3/2008 | Finarov et al. |
| 2009/0042108 | A1 | 2/2009 | Yasuzato |
| 2010/0267682 | A1 | 10/2010 | Johri et al. |
| 2011/0122496 | A1 | 5/2011 | Schaar et al. |
| 2012/0253325 | A1 | 10/2012 | Sniffin et al. |
| 2013/0193602 | A1 | 8/2013 | Suzuki et al. |
| 2013/0252429 | A1 | 9/2013 | Okamoto et al. |
| 2013/0278942 | A1 | 10/2013 | Jeong et al. |
| 2014/0065736 | A1 | 3/2014 | Amir et al. |
| 2014/0240704 | A1 | 8/2014 | Komine et al. |
| 2015/0235880 | A1 | 8/2015 | Inada et al. |
| 2016/0300767 | A1 | 10/2016 | Ko et al. |
| 2017/0146338 | A1 | 5/2017 | Allen |
| 2017/0146810 | A1 | 5/2017 | Levinski et al. |
| 2017/0268869 | A1 | 9/2017 | Levinski et al. |
| 2017/0269482 | A1 | 9/2017 | Flaes et al. |
| 2017/0307367 | A1 | 10/2017 | Yaegashi et al. |
| 2018/0003630 | A1 | 1/2018 | Grunzweig et al. |
| 2018/0024054 | A1 | 1/2018 | Moon et al. |
| 2018/0246420 | A1 | 8/2018 | Pandey et al. |
| 2019/0033726 | A1 | 1/2019 | Adam et al. |
| 2019/0049373 | A1 | 2/2019 | Levinski |
| 2019/0285996 | A1 | 9/2019 | Shibayama et al. |
| 2019/0310080 | A1 | 10/2019 | Hill et al. |
| 2021/0072021 | A1 | 3/2021 | Hill et al. |
| 2021/0072650 | A1 | 3/2021 | Feler et al. |
| 2021/0364279 | A1 | 11/2021 | Manassen et al. |
| 2022/0034652 | A1 | 2/2022 | Manassen et al. |
| 2022/0035257 | A1 | 2/2022 | Goorden et al. |
| 2023/0133640 | A1 | 5/2023 | Hill et al. |
| 2023/0314319 | A1 | 10/2023 | Manassen et al. |

FOREIGN PATENT DOCUMENTS

| | | | |
|---|---|---|---|
| JP | 2002134394 A | 5/2002 | |
| JP | 2007140460 | 2/2009 | |
| JP | 2010267682 A | 11/2010 | |
| JP | 2011243664 A | 12/2011 | |
| JP | 2012253325 A | 12/2012 | |
| JP | 2013074258 A | 4/2013 | |
| JP | 2013254780 | 7/2015 | |
| JP | 2015154008 A | 8/2015 | |
| KR | 1020150018456 A | 2/2015 | |
| KR | 1020150121275 A | 10/2015 | |
| TW | 202043906 A | 12/2020 | |
| TW | 202117275 A | 5/2021 | |
| WO | 2020057900 A1 | 3/2020 | |
| WO | 2021050305 A1 | 3/2021 | |
| WO | WO-2021121733 A1 * | 6/2021 | ......... G03F 7/70616 |
| WO | 2022031565 A1 | 2/2022 | |

OTHER PUBLICATIONS

Buttgereit, et al., "Phame(R)—high resolution off-axis phase shift measurements on 45nm node features," 24th European Mask and Lithography Conference, 2008, pp. 1-7, doi: 10.1117/12.798805.

Di, et al., "Moire-Based Absolute Interferometry With Large Measurement Range in Wafer-Mask Alignment", IEEE Photonics Technology Letters, vol. 27, No. 4, pp. 435-438, 2015. doi:10.1109/LPT.2014.2377037.

Fesperman Jr., Ronnie Rex, (2006). Multiscale Alignment and Positioning System. (UMI 3264369) [Doctor of Philosophy, University of North Carolina] ProQuest Information and Learning Company.

Kikuchi et al., "Principle and observation of fluorescence moire fringes for alignment in print and imprint methods" J. Vac. Sci. Technol. B 35, 06G303 (2017); https://doi.org/10.1116/1.4990844, Submitted: Jun. 19, 2017 . Accepted: Aug. 31, 2017 . Published Online: Sep. 26, 2017.

Korean Intellectual Property Office, International Search Report and Written Opinion for International Application No. PCT/US2023/012454, May 30, 2023, 9 pages.

Moon, et al., "Immunity to Signal Degradation by Overlayers Using a Novel Spatial-Phase-Matching Alignment System", J. Vac. Sci. Technol. B 13, 2648-2652 (1995).

Servin, et al., "Mask contribution on CD & OVL errors budgets for Double Patterning Lithography," 25th European Mask and Lithography Conference, 2009, pp. 1-13.

Wu, et al., (2012). Nanoimprint lithography with ≤60 nm overlay precision. Applied Physics A, 106, 767-772.

Zhou, et al., (2015). Moiré-Based Interferometry for Magnification Calibration of Bitelecentric Lens System. IEEE Photonics Journal. 7. 1-11. 10.1109/JPHOT.2015.2500892.

Zhou, et al., "Fourier-based analysis of moire fringe patterns of superposed gratings in alignment of nanolithography", Optics Express, vol. 16, No. 11, p. 7869, 2008. doi: 10.1364/OE.16.007869.

Zhu et al. Four-quadrant gratings moire fringe alignment measurement in proximity lithography. Optics Express. Feb. 2013;21(3):3463-3473. DOI: 10.1364/oe.21.003463. PMID: 23481804.

Zhu, et al., (2015). Adjustment Strategy for Inclination Moire Fringes in Lithography by Spatial Frequency Decomposition. IEEE Photonics Technology Letters. 27. 395-398. 10.1109/LPT.2014.2370072.

Taiwan Patent Office, Office Action received in TW Application No. 111146878, Aug. 29, 2025, 18 pages (including translation).

* cited by examiner

900

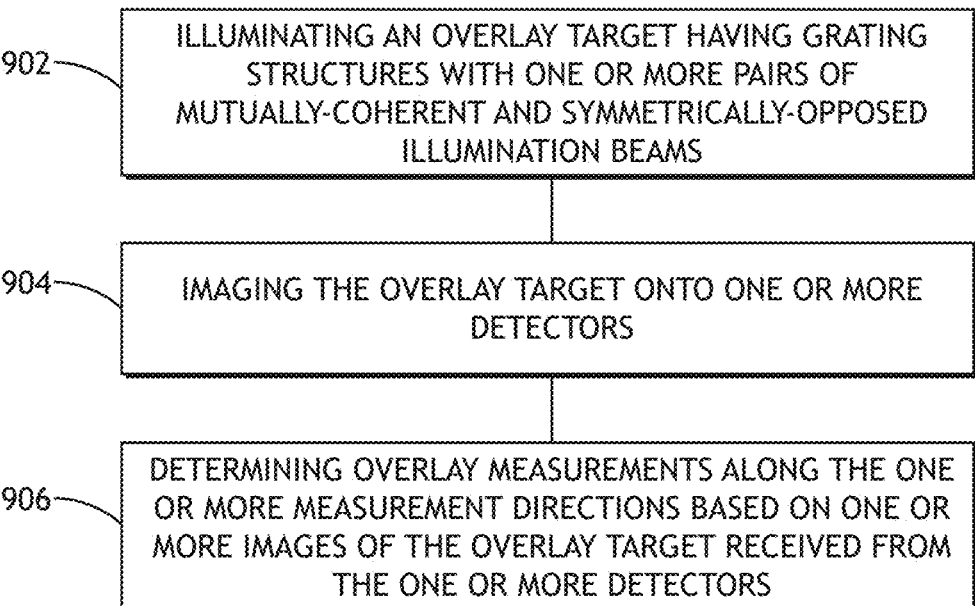

902 — ILLUMINATING AN OVERLAY TARGET HAVING GRATING STRUCTURES WITH ONE OR MORE PAIRS OF MUTUALLY-COHERENT AND SYMMETRICALLY-OPPOSED ILLUMINATION BEAMS

904 — IMAGING THE OVERLAY TARGET ONTO ONE OR MORE DETECTORS

906 — DETERMINING OVERLAY MEASUREMENTS ALONG THE ONE OR MORE MEASUREMENT DIRECTIONS BASED ON ONE OR MORE IMAGES OF THE OVERLAY TARGET RECEIVED FROM THE ONE OR MORE DETECTORS

FIG.9

IMAGING OVERLAY WITH MUTUALLY COHERENT OBLIQUE ILLUMINATION

CROSS-REFERENCE TO RELATED APPLICATION

The present application claims priority to and the benefit of U.S. patent application Ser. No. 17/863,216 filed Jul. 12, 2022, which claims the benefit of U.S. Provisional Application Ser. No. 63/309,715 filed Feb. 14, 2022; both of which are incorporated herein by reference in their entireties.

TECHNICAL FIELD

The present disclosure relates generally to overlay metrology and, more particularly, to dark-field imaging overlay metrology with mutually-coherent oblique illumination.

BACKGROUND

Overlay metrology systems typically characterize the overlay alignment of multiple layers of a sample by measuring the relative positions of overlay target features located on layers of interest. As the size of fabricated features decreases and the feature density increases, the demands on overlay metrology systems needed to characterize these features increase. Accordingly, it is desirable to develop systems and methods to address these demands.

SUMMARY

An overlay metrology system is disclosed in accordance with one or more illustrative embodiments of the present disclosure. In one illustrative embodiment, the system includes one or more illumination sources to generate one or more pairs of illumination beams when implementing a metrology recipe, where the illumination beams within each of the pairs of illumination beams are mutually coherent. In another illustrative embodiment, the system includes one or more illumination optics to direct the pairs of illumination beams to an overlay target on a sample when implementing the metrology recipe, where the illumination beams within a particular one of the pairs of illumination beams are directed to the overlay target with common altitude incidence angles and symmetrically opposed azimuthal incidence angles along a selected illumination direction. In another illustrative embodiment, the overlay target in accordance with the metrology recipe includes two or more grating structures distributed along one or more measurement directions. In another illustrative embodiment, the system includes one or more imaging optics to image the overlay target onto one or more detectors when implementing the metrology recipe, where the image of a particular one of the two or more grating structures is generated exclusively with a single non-zero diffraction order of light from each of the illumination beams within the particular one of the pairs of illumination beams. In another illustrative embodiment, the system includes a controller to determine overlay measurements along the one or more measurement directions based on one or more images of the overlay target received from the one or more detectors.

An overlay metrology method is disclosed in accordance with one or more illustrative embodiments of the present disclosure. In one illustrative embodiment, the method includes illuminating an overlay target on a sample with one or more pairs of illumination beams, where the illumination beams within each of the pairs of illumination beams are mutually coherent. In another illustrative embodiment, the illumination beams within a particular one of the pairs of illumination beams are directed to the overlay target with common altitude incidence angles and symmetrically opposed azimuthal incidence angles along a selected illumination direction. In another illustrative embodiment, the overlay target in accordance with a metrology recipe includes two or more grating structures distributed along one or more measurement directions. In another illustrative embodiment, the method includes imaging the overlay target onto one or more detectors, where the image of a particular one of the two or more grating structures is generated exclusively with a single non-zero diffraction order of light from each of the illumination beams within a particular one of the pairs of illumination beams. In another illustrative embodiment, the method includes determining overlay measurements along the one or more measurement directions based on one or more images of the overlay target received from the one or more detectors.

An overlay metrology system is disclosed in accordance with one or more illustrative embodiments of the present disclosure. In one illustrative embodiment, the system includes a controller. In another illustrative embodiment, the controller determines overlay measurements along one or more measurement directions based on one or more images of one or more overlay targets received from one or more detectors. In another illustrative embodiment, the overlay target in accordance with the metrology recipe includes two or more grating structures distributed along the one or more measurement directions. In another illustrative embodiment, the one or more images of the one or more overlay targets are generated based on illumination with one or more pairs of illumination beams. In another illustrative embodiment, the illumination beams within each of the pairs of illumination beams are mutually coherent. In another illustrative embodiment, the illumination beams within the particular one of the pairs of illumination beams are directed to the overlay target with common altitude incidence angles and symmetrically opposed azimuthal incidence angles along a selected illumination direction. In another illustrative embodiment, the image of a particular one of the two or more grating structures is generated exclusively with a single non-zero diffraction order of light from each of the illumination beams within a particular one of the pairs of illumination beams.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

FIG. 9 is a flow diagram illustrating steps performed in a method for overlay metrology with mutually-coherent illumination beams, in accordance with one or more embodiments of the present disclosure.

DETAILED DESCRIPTION

Figure 1A:
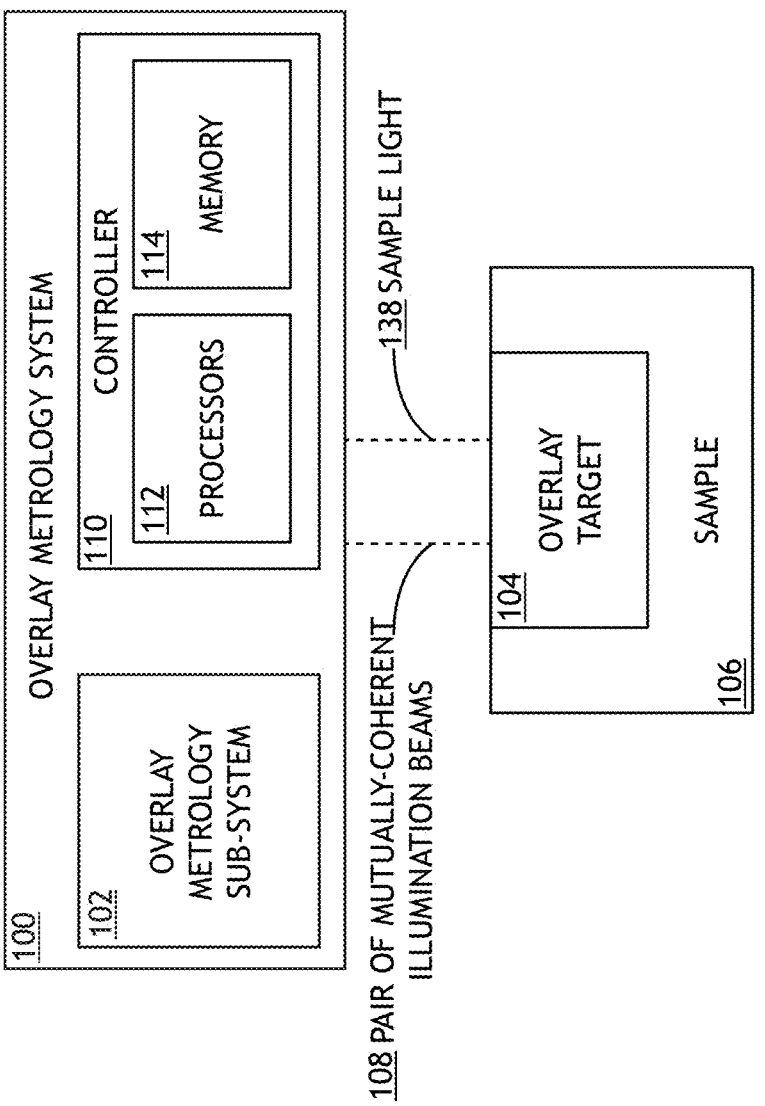
FIG. 1A is a conceptual view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for overlay metrology with pairs of mutually-coherent illumination beams (e.g., mutually-coherent illumination beam pairs), where each illumination beam fully illuminates an overlay target. In particular, embodiments of the present disclosure are directed to illuminating an overlay target with a pair of mutually-coherent illumination beams at symmetric azimuth angles for each measurement direction of interest. For example, an overlay measurement for a single measurement direction may utilize one pair of mutually-coherent illumination beams, while an overlay measurement for two measurement directions (e.g., two orthogonal measurement directions) may utilize two pairs of mutually-coherent illumination beams. Further, although illumination beams within each pair are mutually coherent, it is not necessary for beams in different pairs to be mutually coherent. Rather, it may be beneficial but not required that the pairs of illumination beams are incoherent with respect to each other.

An overlay target and/or an overlay metrology tool suitable for characterizing the overlay target may be configured to according to a metrology recipe suitable for generating overlay measurements based on a desired technique. More generally, an overlay metrology tool may be configurable according to a variety of metrology recipes to perform overlay measurements using a variety of techniques and/or perform overlay measurements on a variety of overlay targets with different designs.

For example, a metrology recipe may include various aspects of an overlay target or a design of an overlay target including, but not limited to, a layout of target features on one or more sample layers, feature sizes, or feature pitches. As another example, a metrology recipe may include illumination parameters such as, but not limited to, an illumination wavelength, an illumination pupil distribution (e.g., a distribution of illumination angles and associated intensities of illumination at those angles), a polarization of incident illumination, a spatial distribution of illumination, or a sample height. By way of another example, a recipe of an overlay metrology tool may include collection parameters such as, but not limited to, a collection pupil distribution (e.g., a desired distribution of angular light from the sample to be used for a measurement and associated filtered intensities at those angles), collection field stop settings to select portions of the sample of interest, polarization of collected light, or wavelength filters.

In some embodiments, an overlay metrology tool is configured (e.g., according to a metrology recipe) to image an overlay target having periodic structures using a single non-zero diffraction lobe from each illumination beam in a mutually-coherent illumination beam pair. In this configuration, the periodic structures from the overlay target may be imaged in a dark-field imaging mode as sinusoidal interference patterns. Further, overlay may be determined by comparing relative phases of various imaged sinusoidal patterns of an overlay target. An overlay metrology system may be configured in multiple ways in accordance with the systems and method disclosed herein. In some embodiments, an overlay metrology system is configured to direct a pair of mutually-coherent illumination beams to an overlay target outside a numerical aperture (NA) of an objective lens used to collect light from the overlay target for imaging, which is referred to herein as outside-the-lens (OTL) illumination. In this configuration, zero-order diffraction naturally falls outside the NA of the objective lens and is not collected. In some embodiments, an overlay metrology system is configured to direct a pair of mutually-coherent illumination beams to an overlay target within a numerical aperture (NA) of an objective lens used to collected light from the overlay target for imaging, which is referred to herein as through-the-lens (TTL) illumination. In this configuration, the overlay metrology system may include one or more elements to block zero-order diffraction such that it does not contribute to image formation.

It is contemplated herein that various overlay target designs are suitable for overlay measurements with mutually-coherent illumination beam pairs as disclosed herein. In some embodiments, an overlay target is an advanced imaging metrology (AIM) target. In this configuration, each cell of the overlay target may include grating structures from different lithographic exposures in non-overlapping regions on one or more layers, where the grating structures from the different lithographic exposures have the same pitch. In some embodiments, an overlay target is a Moiré target. In this configuration, each cell may include grating structures from different lithographic exposures in overlapping regions on two layers to form grating-over-grating structures or Moiré structures, where the grating structures from the different lithographic exposures have different pitches. Further, a cell may include a pair of Moiré structures in which the pitches on the constituent layers are reversed relative to each other. For example, a first Moiré structure may have a first pitch (P) on a first layer and a second pitch (Q) on a second layer, while a second Moiré structure may have the first pitch (P) on the second layer and the second pitch (Q) on the first layer. Such an overlay target may be referred to as a robust-AIM (r-AIM) overlay target and provides that an overlay measurement may be determined based on relative phases between the two Moiré structures.

It is contemplated herein that overlay metrology based on mutually-coherent illumination beam pairs as disclosed herein may provide multiple advantages relative to existing image-based overlay metrology techniques based on spatially-incoherent illumination including, but not limited to, support of fine grating pitches, high image contrast, high image brightness, matched brightness between cells of an overlay target, insensitivity to monochromatic aberrations (e.g., defocus, or the like), minimal encroachment of cell edges, and/or minimal stray light.

For example, image contrast of periodic features is high (maximized in some cases) by interfering only two diffracted orders with equal amplitudes. As another example, image brightness is high (maximized in some cases) based on the use of spatially coherent laser illumination which avoids light loss related to removing coherence for incoherent imaging with high-brightness laser sources. As another example in the case of an r-AIM target, image brightness is matched between target cells since only grating pitches differ between cells. As another example, overlay measurements are insensitive to monochromatic aberrations and defocus due to the sampling of only two points in a pupil by the collected diffraction orders and further due to the sampling of the same points by cells from different layers. As another example, the use of oblique illumination (and OTL illumination in some cases) mitigates cell edge ringing in generated images. As another example, the use of OTL configurations in particular may further limit light loss of the mutually-coherent illumination beams since they do not propagate through the objective lens. Such configurations also limit a number of ghost reflections or scattering sites since relatively fewer optical surfaces are used as well as mitigate back-scattered illumination onto an imaging detector.

Referring now to FIGS. 1A-9, systems and methods for overlay metrology based on mutually-coherent illumination beam pairs is described in greater detail, in accordance with one or more embodiments of the present disclosure.

FIG. 1A is a conceptual view of an overlay metrology system 100, in accordance with one or more embodiments of the present disclosure.

In some embodiments, the overlay metrology system 100 includes an overlay metrology sub-system 102 configured to illuminate an overlay target 104 on a sample 106 with a pair of mutually-coherent illumination beams 108 per measurement direction of interest. In particular, each of the illumination beams 108a,b may fully illuminate the entirety of an overlay target 104. In this way, each cell of the overlay target 104 receives common illumination conditions to promote matched image brightness for all of the cells.

Figure 2A:
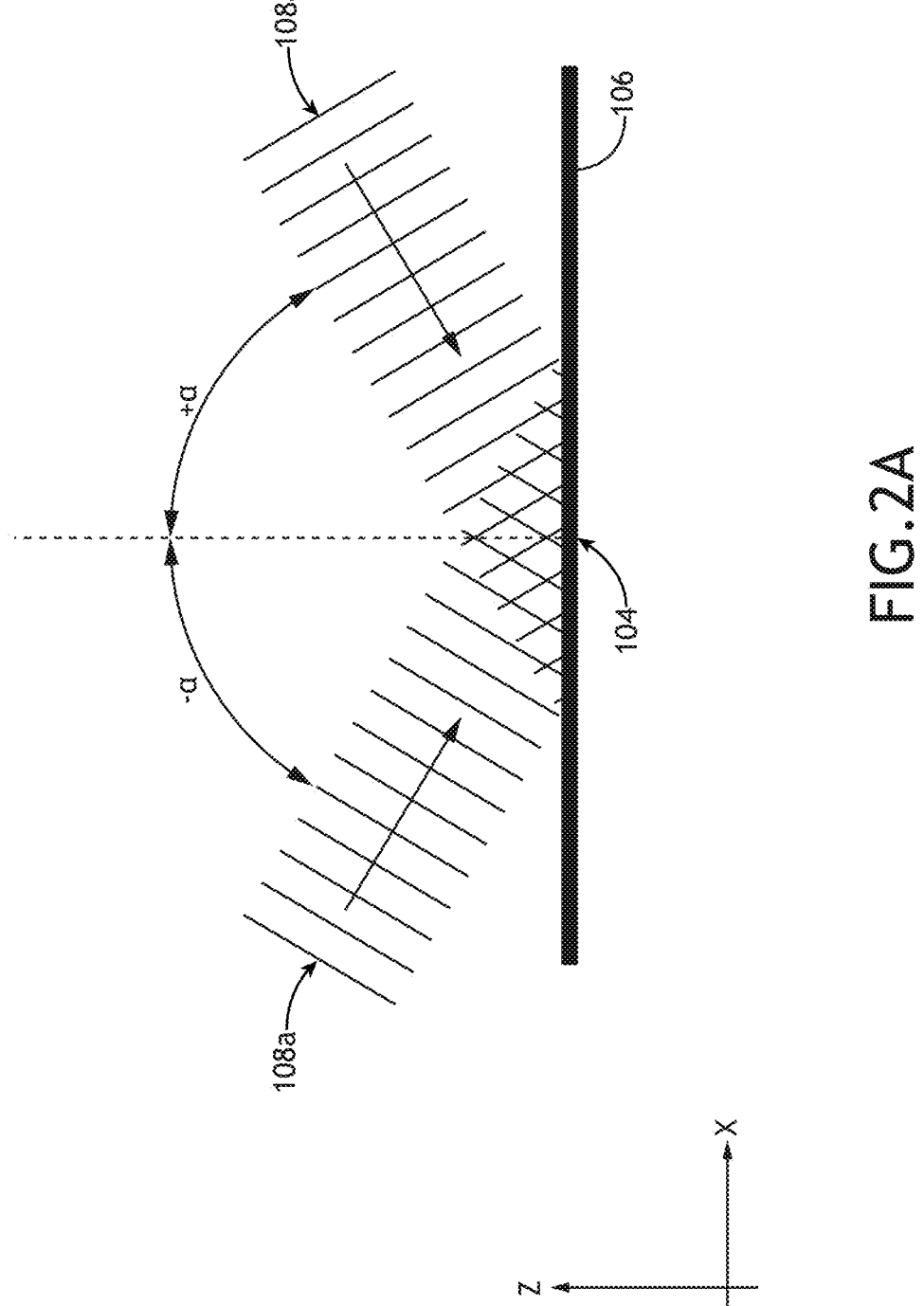
FIG. 2A is a conceptual diagram of illuminating an overlay target with a pair of mutually-coherent illumination beams, in accordance with one or more embodiments of the present disclosure.

FIG. 2A is a conceptual diagram of illuminating an overlay target 104 with a pair of mutually-coherent illumination beams 108, in accordance with one or more embodiments of the present disclosure. FIG. 2A depicts two illumination beams 108a,b as a pair of mutually-coherent illumination beams 108, where each illumination beam 108 is depicted as providing a planar wavefront. In some embodiments, the overlay metrology sub-system 102 directs a pair of mutually-coherent illumination beams 108 at symmetric incidence angles. For example, the illumination beams 108a,b have symmetric polar incidence angles ($\pm\alpha$) and symmetric (e.g., opposing) azimuth incidence angles. In FIG. 2A, this is illustrated by the two illumination beams 108a,b propagating in opposite azimuth directions in a plane of the figure.

Figures 2B, 2C:
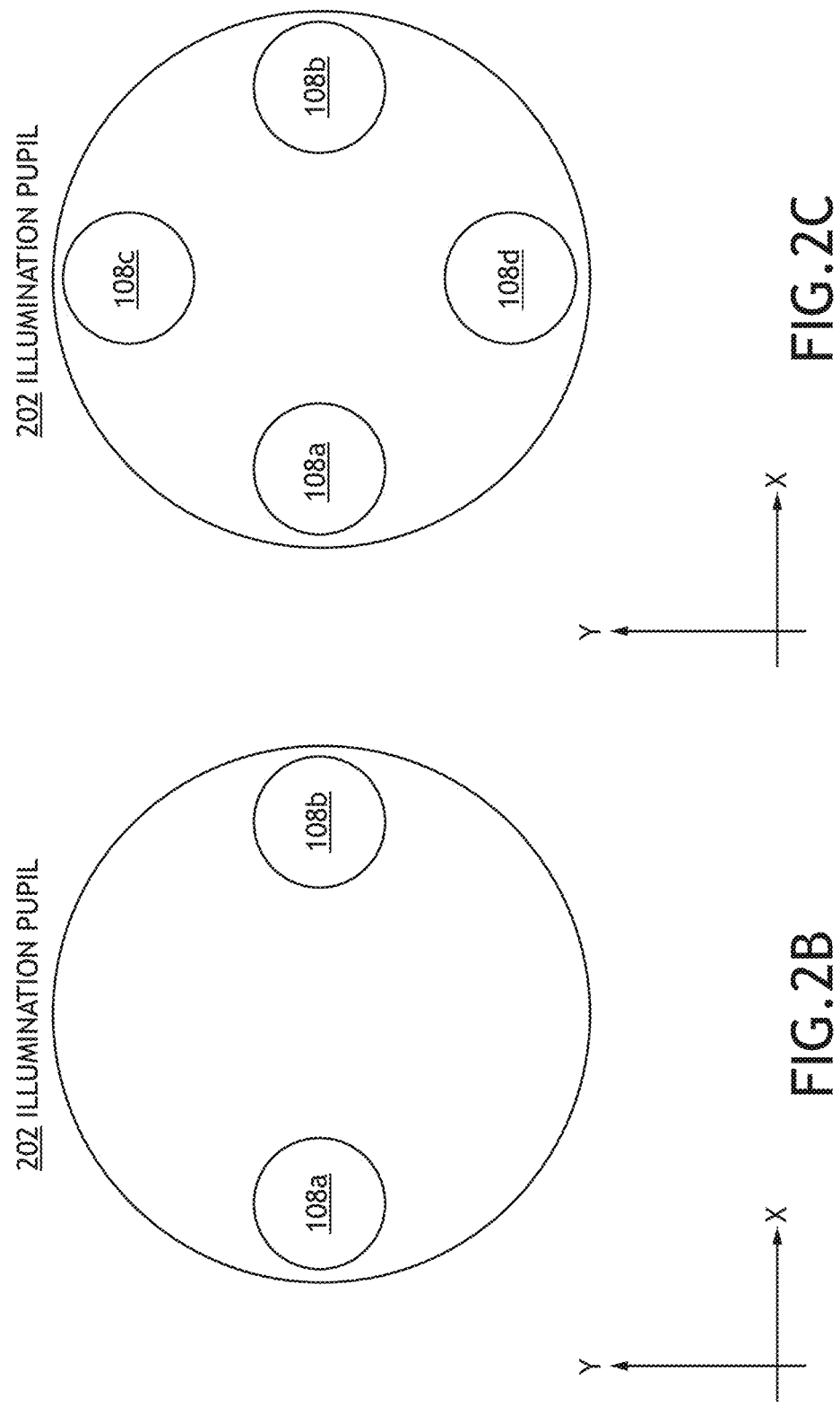
FIG. 2B is a top view of an illumination pupil illustrating the illumination beams of FIG. 2A, in accordance with one or more embodiments of the present disclosure.
FIG. 2C is a top view of an illumination pupil illustrating two pairs of mutually-coherent illumination beams, in accordance with one or more embodiments of the present disclosure.

FIG. 2B is a top view of an illumination pupil 202 illustrating the illumination beams 108a,b of FIG. 2A, in accordance with one or more embodiments of the present disclosure. In FIG. 2B, the symmetric altitude and azimuth angles are also evident. For example, FIG. 2B illustrates the pair of mutually-coherent illumination beams 108a,b as dipole illumination. In some embodiments, such an overlay target 104 includes grating structures along the X direction. In some embodiments, such an overlay target 104 includes grating structures along a different direction. In this case, the distribution in FIG. 2B may be a rotated dipole configuration.

FIG. 2C is a top view of an illumination pupil 202 illustrating two pairs of mutually-coherent illumination beams 108, in accordance with one or more embodiments of the present disclosure. In particular, FIG. 2C depicts a first pair of mutually-coherent illumination beams 108a,b oriented along the X direction in the figure and a second pair of mutually-coherent illumination beams 108c,d oriented along the Y direction in the figure. In this way, FIG. 2C illustrates two pairs of mutually-coherent illumination beams 108 as quadrupole illumination. It is contemplated herein that the quadrupole illumination distribution of FIG. 2C may be suitable for imaging a two-dimensional (2D) overlay target 104 having grating structures oriented along two different (e.g., orthogonal) directions. In some embodiments, such a 2D overlay target 104 includes grating structures along the X and Y directions. In some embodiments, such a 2D overlay target 104 includes grating structures along two different orthogonal directions. In this case, the distribution in FIG. 2C may be a rotated quadrupole configuration.

In some embodiments, all four illumination beams 108a-d are mutually coherent. In some embodiments, different pairs of mutually-coherent illumination beams 108 are incoherent with respect to each other. For example, the first pair of mutually-coherent illumination beams 108a,b may be mutually coherent with respect to each other, but incoherent with respect to the second pair of mutually-coherent illumination beams 108c,d.

Referring again to FIG. 1A, the overlay metrology sub-system 102 may image an overlay target 104 based on a single non-zero diffraction lobe associated with each illumination beam 108 in each pair of mutually-coherent illumination beams 108. In this way, the overlay metrology sub-system 102 may provide a dark-field image since zero-order diffraction of the illumination beams 108 does not contribute to image formation. Further, since each pair of illumination beams 108 is mutually coherent, the single diffraction lobe associated with each illumination beam 108 in the pair interfere to form a sinusoidal interference pattern in the image. As a result, the various grating structures in the overlay target 104 may be imaged with high contrast as pure sinusoids such that overlay measurements may be generated based on comparisons of relative phases of the neighboring cell images in accordance with a metrology recipe.

In some embodiments, the overlay metrology system 100 includes a controller 110 communicatively coupled to the overlay metrology sub-system 102. The controller 110 may be configured to direct the overlay metrology sub-system 102 to generate dark-field images based on one or more selected metrology recipes. The controller 110 may be further configured to receive data including, but not limited to, dark-field images from the overlay metrology sub-system 102. Additionally, the controller 110 may be configured to determine overlay associated with an overlay target 104 based on the acquired dark-field images.

In some embodiments, the controller 110 includes one or more processors 112. For example, the one or more processors 112 may be configured to execute a set of program instructions maintained in a memory 114, or memory device. The one or more processors 112 of a controller 110 may include any processing element known in the art. In this sense, the one or more processors 112 may include any microprocessor-type device configured to execute algorithms and/or instructions. Further, the memory 114 may include any storage medium known in the art suitable for storing program instructions executable by the associated one or more processors 112. For example, the memory 114 may include a non-transitory memory medium. As an additional example, the memory 114 may include, but is not limited to, a read-only memory, a random-access memory, a magnetic or optical memory device (e.g., disk), a magnetic tape, a solid-state drive and the like. It is further noted that the memory 114 may be housed in a common controller housing with the one or more processors 112.

Figure 1B:
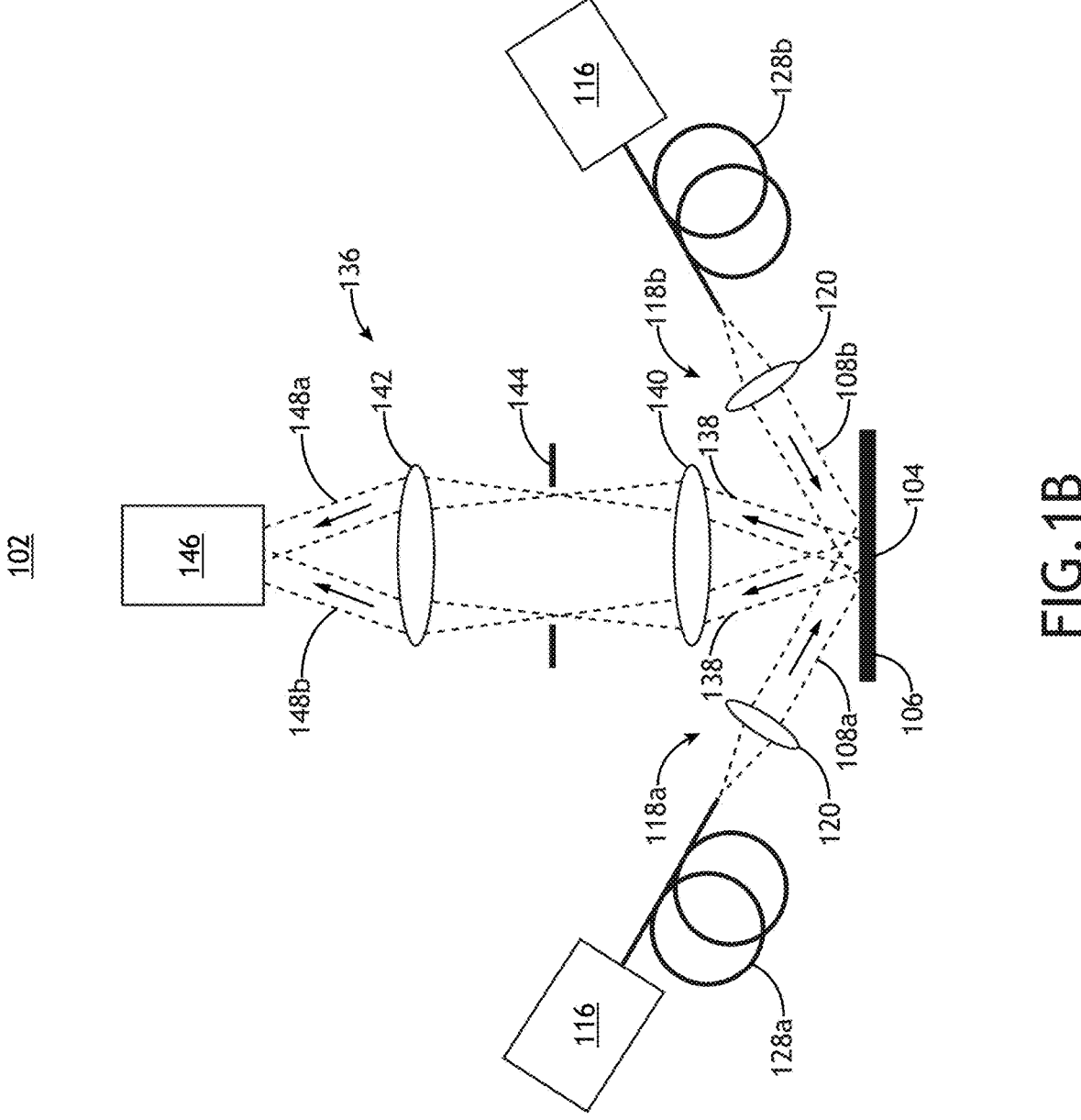
FIG. 1B is a simplified schematic view of an overlay metrology sub-system suitable for illuminating an overlay target with one or more pairs of mutually-coherent illumination beams and imaging the overlay target based on a single non-zero diffraction order from each illumination beam, in accordance with one or more embodiments of the present disclosure.
Figure 1C:
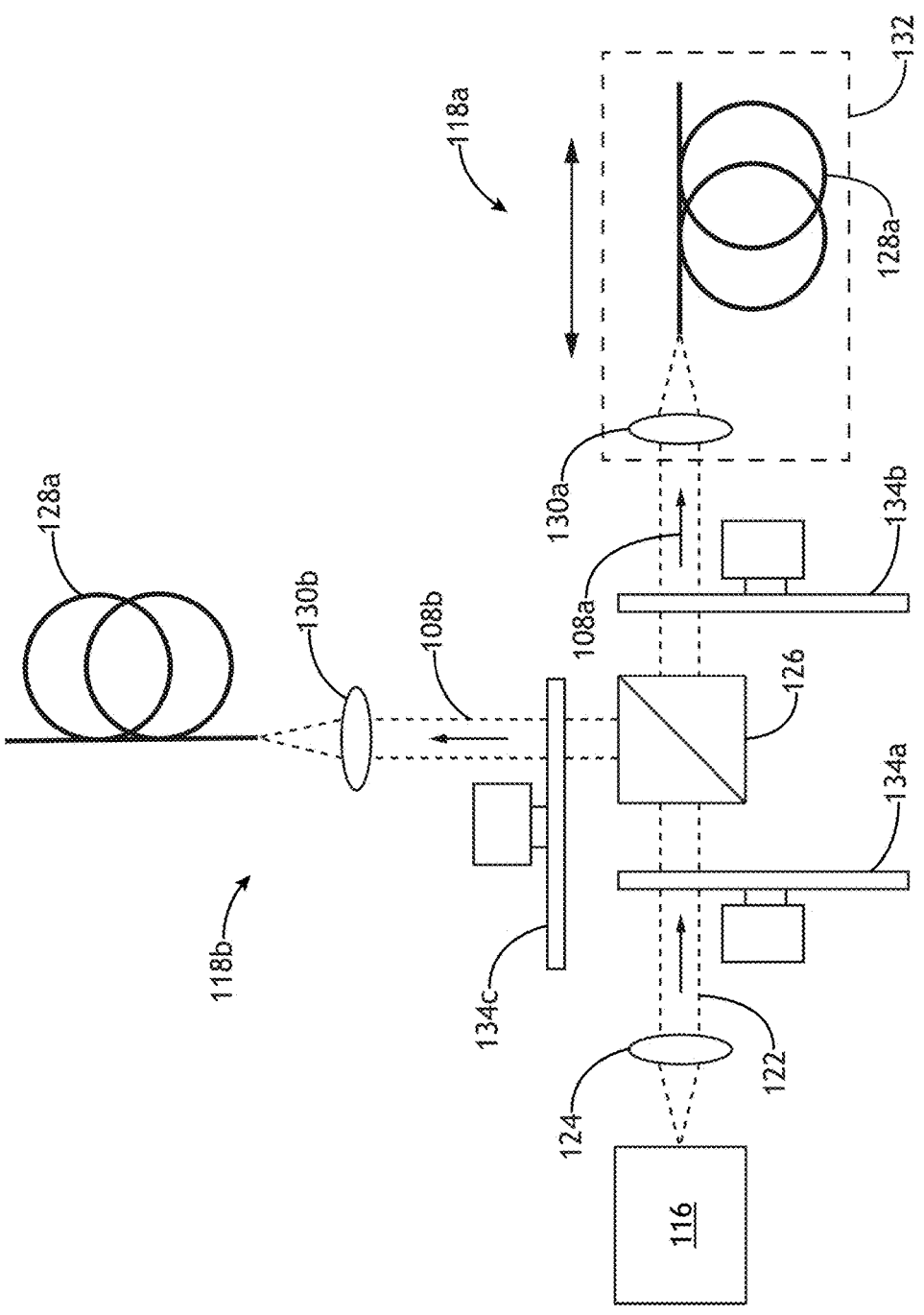
FIG. 1C is a simplified schematic of a portion of an overlay metrology sub-system providing mutually-coherent illumination beams, in accordance with one or more embodiments of the present disclosure.

Referring now to FIGS. 1B and 1C, an overlay metrology sub-system 102 suitable for illuminating an overlay target 104 with one or more pairs of mutually-coherent illumination beams 108 and imaging the overlay target 104 based on a single non-zero diffraction order from each illumination beam 108 is described in greater detail, in accordance with one or more embodiments of the present disclosure.

FIG. 1B is a simplified schematic view of an overlay metrology sub-system 102 suitable for illuminating an over-lay target 104 with one or more pairs of mutually-coherent illumination beams 108 and imaging the overlay target 104 based on a single non-zero diffraction order from each illumination beam 108, in accordance with one or more embodiments of the present disclosure.

In some embodiments, the overlay metrology sub-system 102 includes at least one illumination source 116 configured to generate the one or more pairs of illumination beams 108. Each illumination beam 108 may include one or more selected wavelengths of light including, but not limited to, ultraviolet (UV) radiation, visible radiation, or infrared (IR) radiation.

The illumination source 116 may include any type of illumination source suitable for providing at least one pair of mutually-coherent illumination beams 108. In some embodiments, the illumination source 116 includes at least one laser source. For example, the illumination source 116 may include, but is not limited to, one or more narrowband laser sources, a broadband laser source, a supercontinuum laser source, a white light laser source, or the like. In this regard, the illumination source 116 may provide an illumination beam 108 having high coherence (e.g., high spatial coherence and/or temporal coherence).

In some embodiments, the overlay metrology sub-system 102 includes illumination optics to direct the various illumination beams 108 to an overlay target 104 on the sample 106 through one or more illumination channels 118. Further, the sample 106 may be disposed on a sample stage (not shown) suitable for securing the sample 106 and further configured to position the overlay target 104 with respect to the illumination beams 108.

It is noted that FIG. 1B illustrates the illumination of an overlay target 104 with a single pair of mutually-coherent illumination beams 108. For example, the illumination beams 108 illustrated in FIG. 1B may correspond to the illumination beams 108*a,b* depicted in FIGS. 2A and 2B. In some embodiments, the overlay metrology sub-system 102 illuminates an overlay target 104 with two pairs of mutually-coherent illumination beams 108 (e.g., as depicted in FIG. 2C). In this configuration, the overlay metrology sub-system 102 may include an additional pair of illumination channels 118 oriented in a plane orthogonal to the FIG. 1B.

Each of the illumination channels 118 may include one or more optical components suitable for modifying and/or conditioning an illumination beam 108 as well as directing the illumination beam 108 to the overlay target 104. For example, each of the illumination channels 118 may include, but is not required to include, one or more illumination lenses 120 (e.g., to control a spot size of the illumination beam 108 on the overlay target 104, to relay pupil and/or field planes, or the like), one or more polarizers to adjust the polarization of the illumination beam 108 in the channel, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

Referring now to FIG. 1C, FIG. 1C is a simplified schematic of a portion of an overlay metrology sub-system 102 providing mutually-coherent illumination beams 108, in accordance with one or more embodiments of the present disclosure.

In some embodiments, light 122 from a coherent illumination source 116 is collimated (e.g., with a collimating lens 124) and split using a beamsplitter 126 or other optical element (e.g., a diffractive element, or the like) into two illumination beams 108 propagating along two illumination channels 118*a,b*. The illumination beams 108 may then be directed to the overlay target 104 using any technique known in the art. For example, FIG. 1C depicts focusing the illumination beams 108 into optical fibers 128*a,b* which are also illustrated in FIG. 1B. An optical fiber 128*a,b* may be any type of optical fiber known in the art including, but not limited to, a single-mode fiber, a polarization-maintaining fiber, a single-mode polarization-maintaining fiber, a multi-mode fiber, or the like. However, it is to be understood that the illumination beams 108 may be delivered to the overlay target 104 using any suitable optical elements including, but not limited to, free-space optical elements.

In some embodiments, the overlay metrology sub-system 102 includes one or more components to provide that the optical path lengths of the two illumination channels 118 are identical such that the two wavefronts at the overlay target 104 will be mutually coherent and will thus interfere coherently. The optical path lengths of the two illumination channels 118 may be matched by any technique known in the art. For example, the thickness of all optical components, the refractive index and dispersion of the optical materials and the air path lengths may all be set to be identical. This includes matching the lengths of the two optical fibers 128a. As another example, an optical path length of one or more of the illumination channels 118 may be made adjustable to compensate for any deviations. As an illustration, FIG. 1C depicts an optical fiber 128a and an associated focusing lens 130a of one of the illumination channels 118 on a translation stage 132 to allow the optical path lengths to be precisely matched. For example, the translation stage 132 may be adjusted to maximize a contrast of interference fringes between the wavefronts of the two illumination channels 118 at the overlay target 104.

FIG. 1C further illustrates various filters suitable for manipulating the illumination beams 108 either together or individually. For example, FIG. 1C illustrates a first filter 134a prior to the beamsplitter 126 suitable for manipulating both illumination beams 108. As another example, FIG. 1C illustrates a second filter 134b to individually manipulate the illumination beam 108a and a third filter 134c to individually manipulate the illumination beam 108b. The filters 134a-c may be any type of filter known in the art such as, but not limited to, spectral filters or neutral density filters. Additionally, though not shown, the overlay metrology sub-system 102 may include polarizers to adjust polarizations of the illumination beams 108 together or individually.

It is noted that FIG. 1C illustrates the generation of a single pair of mutually-coherent illumination beams 108a,b. Additional pairs of mutually-coherent illumination beams 108 may be generated using any suitable technique. In some embodiments, the overlay metrology sub-system 102 includes a separate illumination source 116 for each pair of mutually-coherent illumination beams 108 and a separate set of the elements illustrated in FIG. 1C for each source. In some embodiments, the overlay metrology sub-system 102 includes a single illumination source 116 to generate all of the illumination beams 108. In embodiments in which different pairs of illumination beams 108 are not mutually coherent with respect to each other, different pairs of illumination beams 108 from a common illumination source 116 may be made incoherent with respect to each other using any technique including, but not limited to, using different lengths of optical fiber 128a,b for each pair. It is contemplated herein that that providing different pairs of illumination beams 108 that are not mutually coherent with respect to each other may minimize stray light on the generated images and ensure that particular grating structures are imaged only with a single pair of mutually-coherent illumination beams 108.

In some embodiments, the overlay metrology sub-system 102 includes imaging optics within a collection pathway 136 for the collection of light from the overlay target 104 (e.g., sample light 138). In some embodiments, the collection pathway 136 includes an objective lens 140 to collect diffracted or scattered light from the overlay target 104. For example, the objective lens 140 may collect one or more diffracted orders of radiation from the overlay target 104 in response to the illumination beams 108.

The collection pathway 136 may further include multiple optical elements to direct and/or modify illumination collected by the objective lens 140 including, but not limited to one or more lenses 142, one or more filters, one or more polarizers, one or more beam blocks, or one or more beamsplitters. Such elements may be located in any suitable location in the collection pathway 136 including, but not limited to, a collection pupil 144.

In some embodiments, the collection pathway 136 includes a detector 146 configured to generate an image (e.g., a dark-field image) of the overlay target 104. For example, a detector 146 may receive an image of the sample 106 provided by elements in the collection pathway 136 (e.g., the objective lens 140, the one or more lenses 142, or the like).

For example, FIG. 1B illustrates generating a dark-field image of an overlay target 104 with a single non-zero diffraction order from each illumination beam 108 of a pair of mutually-coherent illumination beams 108. In particular, FIG. 1B illustrates the collection of a first non-zero diffraction order 148a associated with a first illumination beam 108a and the collection of a second non-zero diffraction order 148b associated with a second illumination beam 108b, where illumination beams 108a,b are mutually coherent.

It is contemplated herein that the illumination channels 118 and the collection pathway 136 of the overlay metrology sub-system 102 may be oriented in a wide range of configurations suitable for generating a dark-field image of the overlay target 104. For example, FIG. 1B illustrates an OTL configuration in which the various illumination beams 108 are directed to the overlay target 104 outside of a NA of the objective lens 140. In some embodiments, the overlay metrology sub-system 102 directs the illumination beams 108 to the overlay target 104 within the NA of the objective lens 140 in a TTL configuration. For example, the overlay metrology sub-system 102 may include one or more components common to the collection pathway 136 and the illumination channels 118 to simultaneously provide the illumination beams 108 to the objective lens 140 for illumination of the overlay target 104 and direct a single non-zero diffraction order to the detector 146 to contribute to an image of the overlay target 104. As a non-limiting illustration, the overlay metrology sub-system 102 may include an annular mirror located at or near a pupil plane common to both the collection pathway 136 (e.g., conjugate to the collection pupil 144) and the illumination channels 118 (e.g., conjugate to the illumination pupil 202). Such an annular mirror may direct the various illumination beams 108 (e.g., as illustrated in FIGS. 2B and 2C) to the objective lens 140. Such an annular mirror may further block zero-order diffraction of the illumination beams 108 while passing non-zero diffraction orders through a central opening to provide dark-field imaging with high contrast as described herein.

Figure 3:
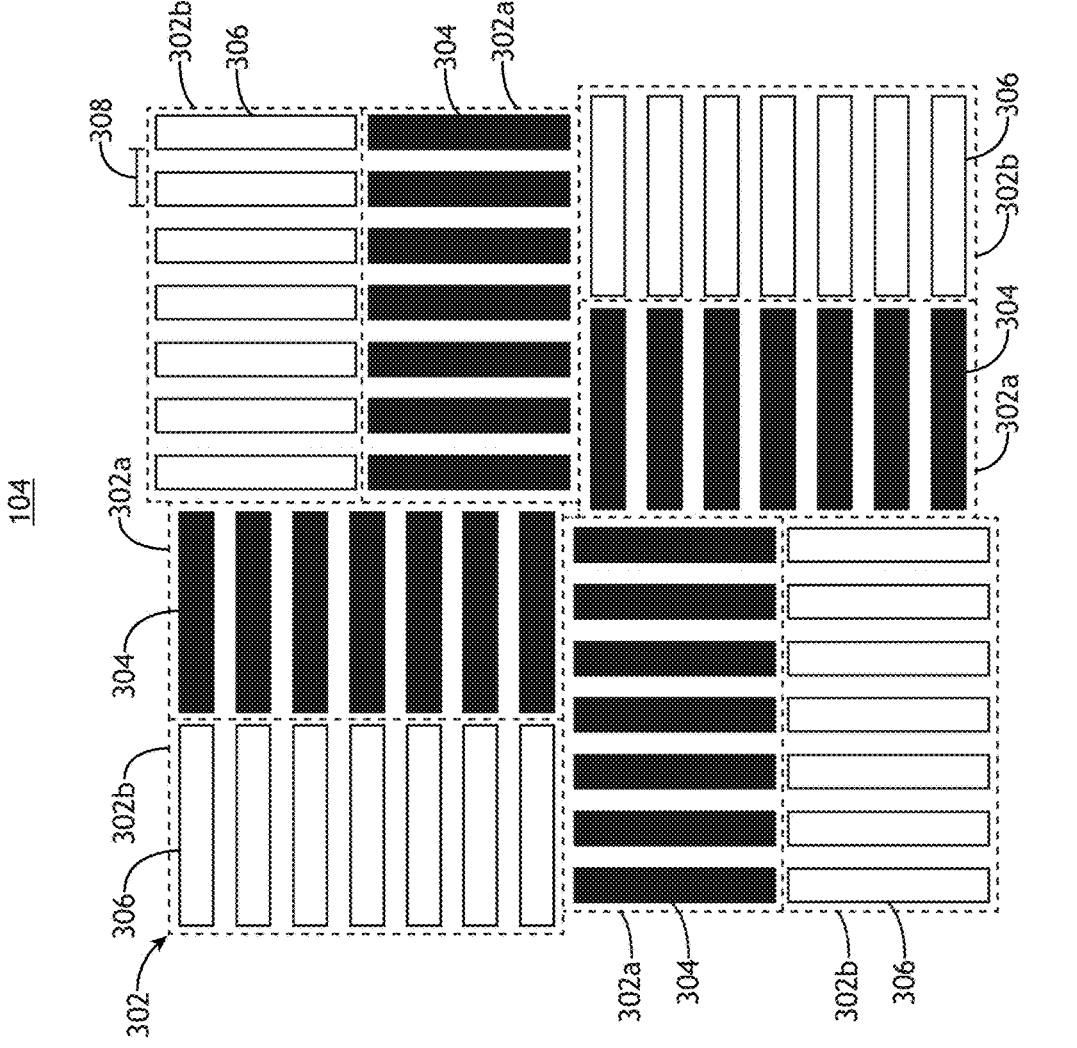
FIG. 3 is a top view of an AIM overlay target, in accordance with one or more embodiments of the present disclosure.
Figure 4:
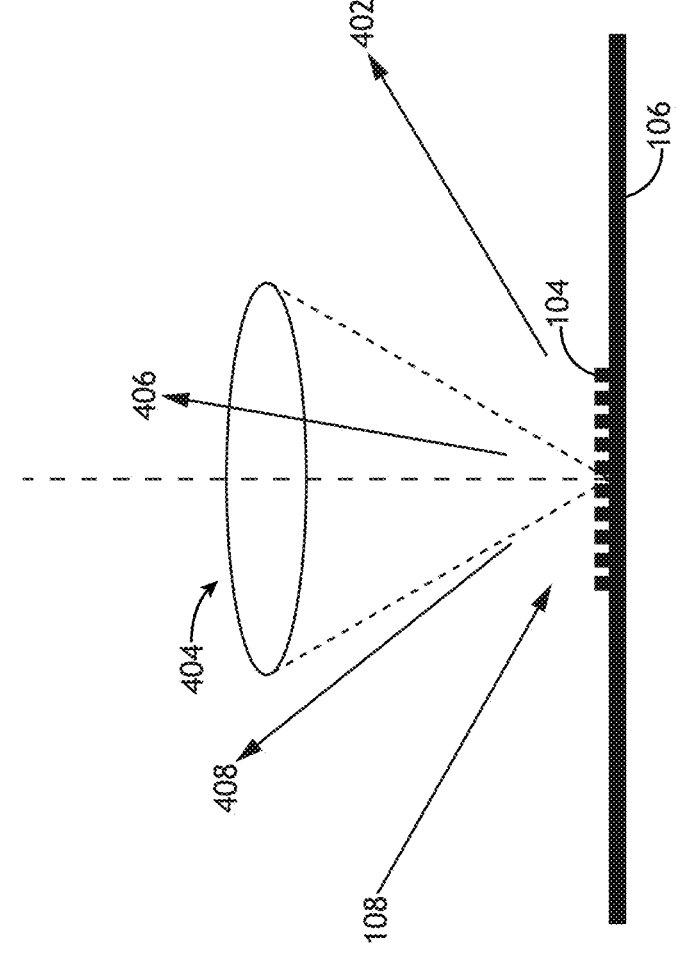
FIG. 4 is a conceptual schematic illustrating the collection of a single non-zero diffraction order from an AIM overlay target, in accordance with one or more embodiments of the present disclosure.
Figure 5:
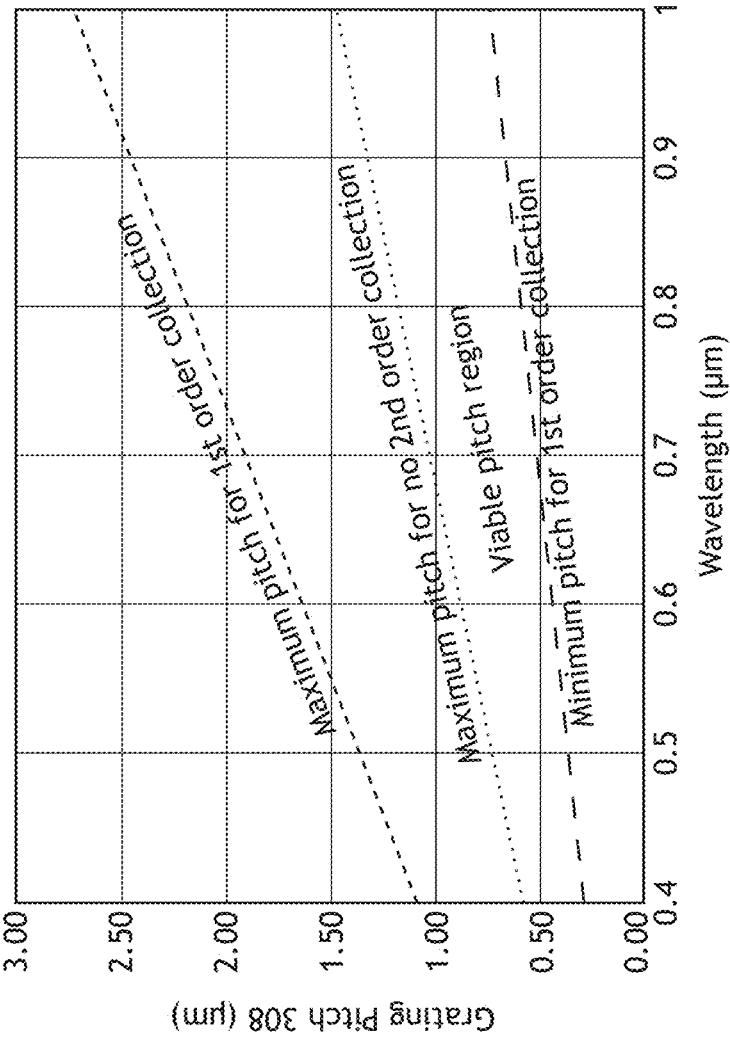
FIG. 5 is a plot illustrating viable values of grating pitch per wavelength assuming a 60-degree illumination incidence angle and 0.5 NA collection for an AIM overlay target, in accordance with one or more embodiments of the present disclosure.

Referring now to FIGS. 3-8, overlay metrology using pairs of mutually-coherent illumination beams 108 and imaging with a single non-zero diffraction order from each of the illumination beams 108 is described for various non-limiting examples of target types. In particular, FIGS. 3-5 depict overlay metrology on AIM targets and FIGS. 6A-8 depict overlay metrology for r-AIM targets.

FIG. 3 is a top view of an AIM overlay target 104, in accordance with one or more embodiments of the present disclosure. In one embodiment, the overlay target 104 includes various cells 302, each including a single grating located on a single layer of the sample 106. For example, the overlay target 104 may include one or more cells 302*a* with first-layer gratings 304 on a first layer of the sample 106 and one or more cells 302*b* second-layer gratings 306 on a second layer of the sample 106. Further, each of the first-layer gratings 304 and the second-layer gratings 306 are formed from features having a common pitch 308. In this regard, diffraction orders from the first-layer gratings 304 and the second-layer gratings 306 may be collocated in the collection pupil 144.

FIG. 4 is a conceptual schematic illustrating the collection of a single non-zero diffraction order from an AIM overlay target 104, in accordance with one or more embodiments of the present disclosure. FIG. 4 depicts an illumination beam 108 directed to an overlay target 104 using an OTL configuration such as that depicted in FIG. 1B. In this configuration, zero-order signals 402 such as zero-order diffraction and specular reflection from the sample 106 naturally lie outside a collection NA 404 (e.g., a NA of the objective lens 140). FIG. 4 further depicts a first-order diffraction lobe 406 within the collection NA 404, while a second-order diffraction lobe 408 lies outside the collection NA 404 and thus does not contribute to image formation.

It is noted that FIG. 4 depicts illumination and collection based on only one illumination beam 108 of a pair of mutually-coherent illumination beams 108 for clarity. It is to be understood illumination with the other illumination beam 108 in the pair of mutually-coherent illumination beams 108 produces a similar result based on the illumination symmetry.

It is to be understood that although FIG. 4 depicts an OTL configuration, a similar result may be achieved with a TTL configuration when zero-order signals 402 (e.g., specular reflection and zero-order diffraction) are blocked in the collection pathway 136 (e.g., by an element in the collection pupil 144).

Referring now to FIG. 5, various conditions for ensuring that only a single non-zero diffraction order for each illumination beam 108 is within the collection NA 404 for image formation are described in greater detail in accordance with one or more embodiments of the present disclosure. It is contemplated herein that an angular distribution of diffraction orders from a grating (and thus a distribution in a collection pupil 144) may be influenced by a variety of factors including, but not limited to, a wavelength of the illumination beam 108 (λ), an incidence angle of the illumination beam 108, a pitch 308 of the grating (D), or a size of the collection NA 404. It is further contemplated herein that all of these factors may be incorporated into or otherwise considered in a metrology recipe. Accordingly, one or more metrology recipes may be generated that dictate aspects of the overlay target 104 and/or the overlay metrology sub-system 102 such that a single non-zero diffraction order per illumination beam 108 may contribute to image formation.

In order to collect a first-order diffraction lobe 406, the pitch 308 (D) of a grating in an overlay target 104 must meet the following conditions:

$$D < \frac{\lambda}{(NA_{ill} - NA_{col})}, \text{ and} \tag{1}$$

$$D > \frac{\lambda}{(NA_{ill} + NA_{col})}. \tag{2}$$

where $NA_{ill}$ is the sine of an incidence angle of the illumination beam 108 and $NA_{col}$ is the sine of the collection half-angle (e.g., the half-angle of the collection NA 404).

In order to avoid collection of a second-order diffraction lobe 408, the grating pitch 308 (D) must also meet the condition:

$$D < \frac{2\lambda}{(NA_{ill} + NA_{col})}. \tag{3}$$

The pitch 308 ($D_{img}$) of the interference between two collected mutually-coherent first-order diffraction lobes 406 (e.g., from the mutually-coherent illumination beams 108) is:

$$D_{img} = \frac{\lambda}{2\left|NA_{ill} - \frac{\lambda}{D}\right|}. \tag{4}$$

FIG. 5 is a plot illustrating viable values of grating pitch 308 per wavelength assuming a 60-degree (0.866 NA) illumination incidence angle and 0.5 NA collection for an AIM overlay target 104, in accordance with one or more embodiments of the present disclosure. As illustrated by Equations (1)-(4) and FIG. 5, a metrology recipe may be configured to provide a combination of grating pitch 308 and wavelength of the illumination beams 108 that satisfies the requirement of collecting only a single non-zero diffraction order (e.g., the first-order diffraction lobe 406) for each illumination beam 108 using an AIM overlay target 104.

Figure 6A:
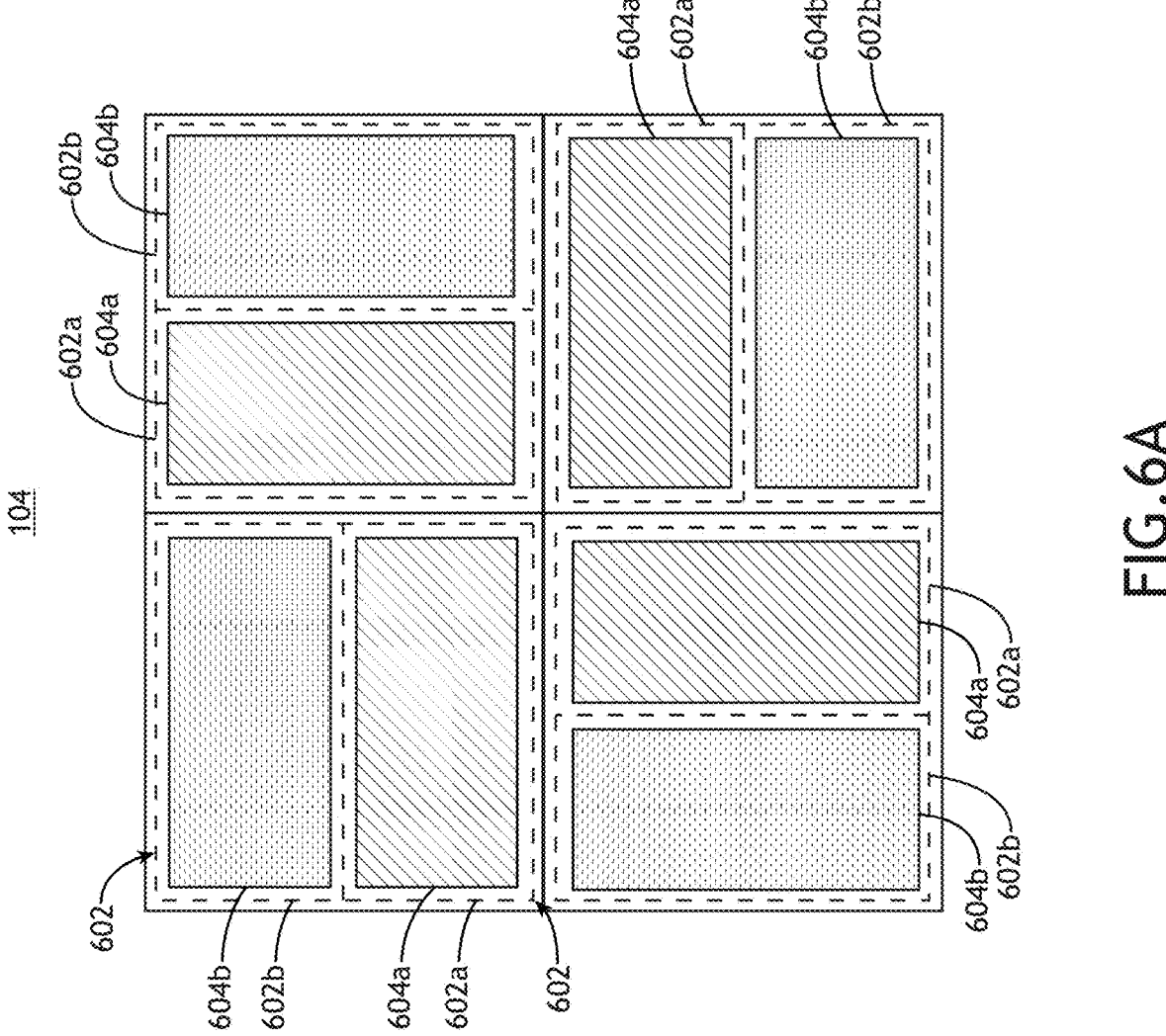
FIG. 6A is a top view of an r-AIM overlay target, in accordance with one or more embodiments of the present disclosure.
Figure 6B:
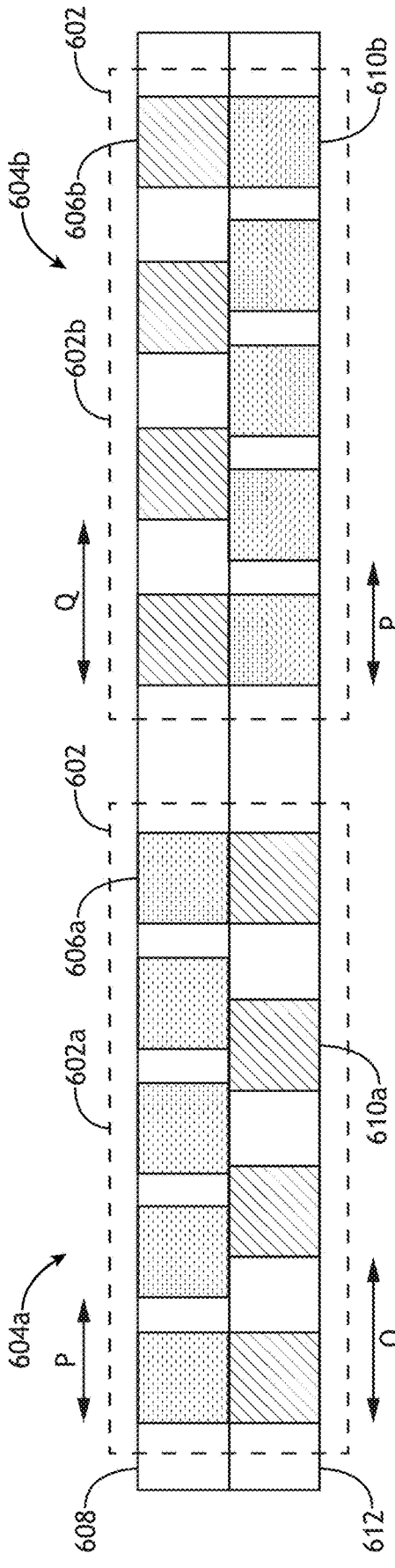
FIG. 6B is a side view of two adjacent cells including Moiré structures that may form a quadrant of an r-AIM overlay target as depicted in FIG. 6A, in accordance with one or more embodiments of the present disclosure.

FIGS. 6A and 6B illustrate an r-AIM overlay target 104, in accordance with one or more embodiments of the present disclosure. FIG. 6A is a top view of an r-AIM overlay target 104, in accordance with one or more embodiments of the present disclosure. FIG. 6B is a side view of two adjacent cells 602 including Moiré structures 604 that may form a quadrant of an r-AIM overlay target 104 as depicted in FIG. 6A, in accordance with one or more embodiments of the present disclosure.

A Moiré structure 604 may include two gratings in overlapping regions of the sample 106, where the two gratings have different pitches. In some embodiments, a r-AIM overlay target 104 includes adjacent Moiré structures 604 having opposite pitches in the corresponding layers. In this way, an overlay error on the sample 106 may cause Moiré diffraction orders associated with a Moiré pitch to move in opposite directions for the two adjacent Moiré structures 604.

For example, FIG. 6B illustrates a first Moiré structure 604*a* having an upper grating 606*a* with a first pitch (P) on a first layer 608 of the sample 106 and a lower grating 610*a* with a second pitch (Q) on a second layer 612 of the sample 106. FIG. 6B also illustrates a second Moiré structure 604*b* having an upper grating 606*b* with the second pitch (Q) on the first layer 608 of the sample 106 and a lower grating 610*b* with the first pitch (P) on the second layer 612 of the sample 106.

Figure 7:
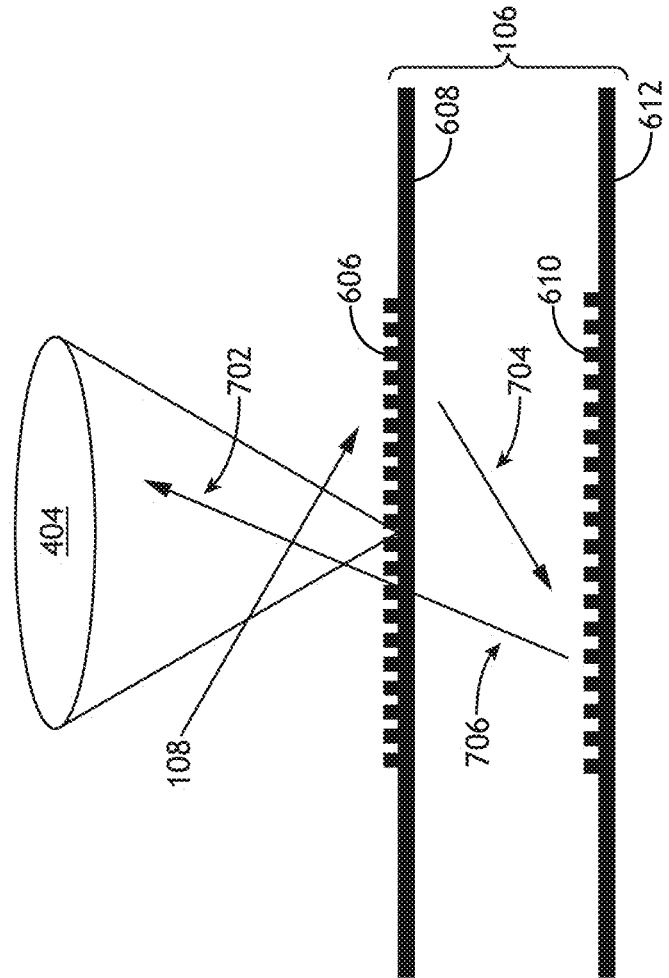
FIG. 7 is a conceptual schematic illustrating the collection of a single non-zero diffraction order from an r-AIM overlay target, in accordance with one or more embodiments of the present disclosure.

FIG. 7 is a conceptual schematic illustrating the collection of a single non-zero diffraction order from an r-AIM overlay target 104, in accordance with one or more embodiments of the present disclosure. FIG. 7 depicts an illumination beam 108 directed to an overlay target 104 using an OTL configuration such as that depicted in FIG. 1B. In this configuration, zero-order signals 402 (not shown in FIG. 7 for clarity) such as zero-order diffraction and specular reflection from the sample 106 naturally lie outside the collection NA 404 (e.g., a NA of the objective lens 140).

FIG. 7 further depicts a Moiré diffraction lobe 702 associated with first-order diffraction from both gratings entering the collection NA 404. For example, the Moiré diffraction lobe 702 is formed from a first-order diffraction lobe 704 from the upper grating 606 that serves as the basis of a first-order diffraction lobe 706 from the lower grating 610.

It is noted that FIG. 7 depicts illumination and collection based on only one illumination beam 108 of a pair of mutually-coherent illumination beams 108 for clarity. It is to be understood illumination with the other illumination beam 108 in the pair of mutually-coherent illumination beams 108 produces a similar result based on the illumination symmetry.

It is to be understood that although FIG. 7 depicts an OTL configuration, a similar result may be achieved with a TTL configuration when zero-order signals 402 (e.g., specular reflection and zero-order diffraction) are blocked in the collection pathway 136 (e.g., by an element in the collection pupil 144).

In some embodiments, a metrology recipe provides the conditions under which all light diffracted from one of the gratings of a Moiré structure 604 fall outside the collection NA 404 and only one Moiré diffraction order associated with diffraction of light by each of the gratings of the Moiré structure 604 falls within the collection NA 404.

In order for first-order diffraction from only one of the gratings of a Moiré structure 604 to be not collected, the following condition must be met for both pitches of the Moiré structure 604 (e.g., pitches P and Q):

$$D_P \text{ and } D_Q < \frac{\lambda}{(NA_{ill} + NA_{col})}. \quad (5)$$

In order for first-order diffraction from the upper grating 606 to propagate to the lower grating 610, the following condition must be met:

$$D_P \text{ and } D_Q > \frac{\lambda}{n(1 + NA_{ill})}, \quad (6)$$

where n is the lowest index of refraction of material in any layer between the upper grating 606 and the lower grating 610. This condition must be met for both pitches P and Q, since in half of the cells 602 the coarser pitch will be on top and in the other half of the cells 602 the finer pitch will be on top.

Figure 8:
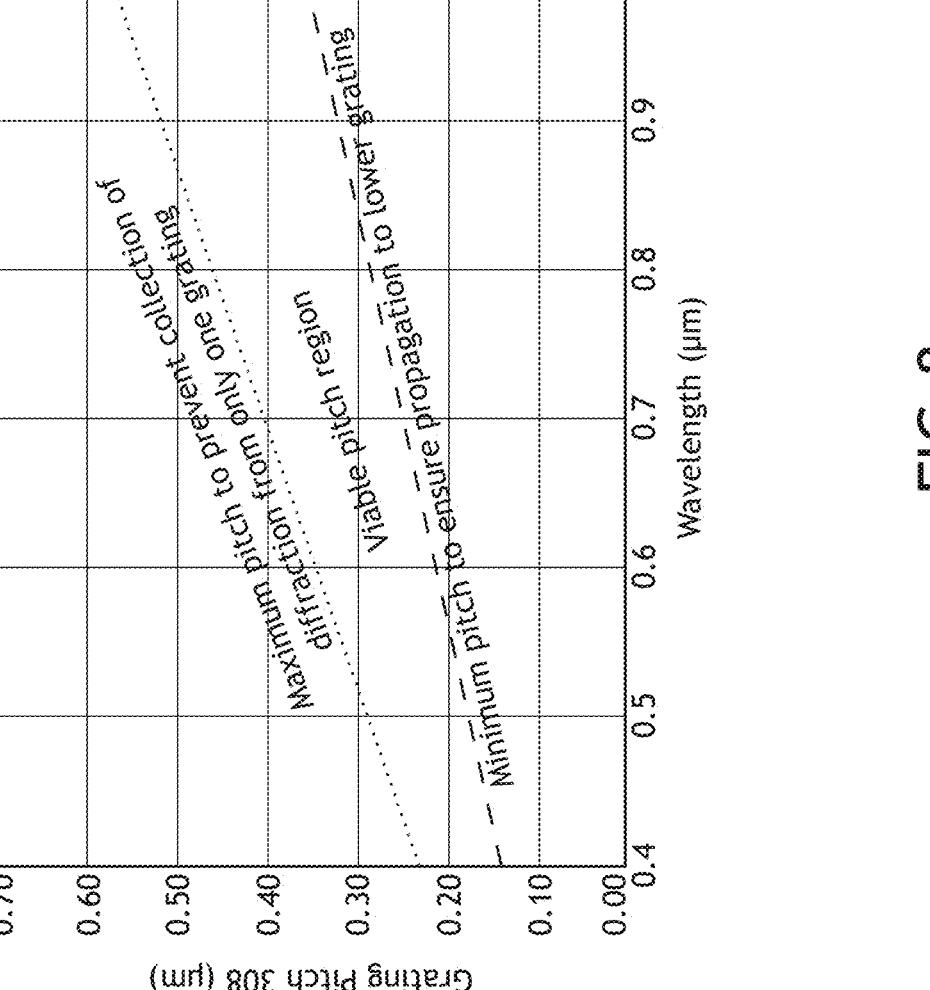
FIG. 8 is a plot illustrating viable values of grating pitch per wavelength assuming a 60-degree illumination incidence angle and 0.5 NA collection for a r-AIM overlay target, in accordance with one or more embodiments of the present disclosure.

FIG. 8 is a plot illustrating viable values of grating pitch 308 (e.g., values of P and/or Q) per wavelength assuming a 60-degree (0.866 NA) illumination incidence angle and 0.5 NA collection for a r-AIM overlay target 104, in accordance with one or more embodiments of the present disclosure. As illustrated by Equations (5)-(6) and FIG. 8, a metrology recipe may be configured to provide a combination of grating pitch 308 and wavelength of the illumination beams 108 that satisfies the requirement of collecting only a single non-zero diffraction order (e.g., a Moiré diffraction lobe 702) for each illumination beam 108 using a r-AIM overlay target 104.

Referring now to FIG. 9, FIG. 9 is a flow diagram illustrating steps performed in a method 900 for overlay metrology with mutually-coherent illumination beams 108, in accordance with one or more embodiments of the present disclosure. Applicant notes that the embodiments and enabling technologies described previously herein in the context of the overlay metrology system 100 should be interpreted to extend to the method 900. It is further noted, however, that the method 900 is not limited to the architecture of the overlay metrology system 100.

In some embodiments, the method 900 includes a step 902 of illuminating an overlay target 104 having grating structures (e.g., gratings, or the like) with one or more pairs of mutually-coherent and symmetrically-opposed illumination beams 108. For example, illumination beams 108 within each pair may be mutually-coherent with respect to each other and directed to the overlay target 104 at opposing incidence angles (e.g., as depicted in FIG. 2). In some embodiments, the illumination beams 108 within different pairs of illumination beams 108 are mutually incoherent with respect to each other. This may facilitate separate image formation of portions of the overlay target 104 with different directions of periodicity based on different pairs of illumination beams 108. In some embodiments, illumination beams 108 within different pairs are mutually-coherent with respect to each other.

The overlay target 104 may have any design known in the art with grating structures including, but not limited to, an AIM target or a r-AIM target. Further, the grating structures may be located on any combination of one or more sample layers, which may be process layers (e.g., layers in which features are formed from one material surrounded by one or more different materials) or resist layers (e.g., layers of a single material in which features are formed as regions of different refractive index than surrounding regions).

In some embodiments, the method 900 includes a step 904 of imaging the overlay target 104 onto one or more detectors, where the image of a particular one of the two or more grating structures is generated exclusively with a single non-zero diffraction order of light from each of the illumination beams 108 within a particular one of the pairs of illumination beams 108 (e.g., illumination beams 108*a*,*b*). In this way, the image may be a dark-field image and the grating structures may appear in the image as a pure sinusoid. As an illustration in the case of an AIM overlay target 104, the image may be formed based on the interference of a single first-order diffraction beam from each of the illumination beams 108 in a pair of mutually-coherent illumination beams 108, where the grating structures appear as sinusoids with the grating pitch 308. As an illustration in the case of a r-AIM overlay target 104, the image may be formed based on the interference of a single Moiré diffraction order associated with diffraction from both constituent grating structures from each of the illumination beams 108 in a pair of mutually-coherent illumination beams 108, where the grating structures appear as sinusoids with the Moiré pitch.

In some embodiments, the method 900 includes a step 906 of determining overlay measurements along the one or more measurement directions based on one or more images of the overlay target 104 received from the one or more detectors. For example, an overlay measurement may be determined based on relative phase shifts between sinusoidal images of adjacent grating structures.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
one or more illumination sources configured to generate one or more pairs of illumination beams when implementing a metrology recipe;
one or more illumination optics configured to direct the one or more pairs of illumination beams to an overlay target on a sample when implementing the metrology recipe, wherein the illumination beams within a particular one of the one or more pairs of illumination beams are directed to the overlay target with common altitude incidence angles and symmetrically opposed azimuthal incidence angles along a selected illumination direction, wherein the overlay target in accordance with the metrology recipe includes two or more grating structures distributed along one or more measurement directions;
one or more detectors;
one or more imaging optics configured to image the overlay target onto the one or more detectors when implementing the metrology recipe, wherein an image of a particular one of the two or more grating structures includes a sinusoidal interference pattern generated exclusively by interference of a single non-zero diffraction order of light from each of the illumination beams within the particular one of the one or more pairs of illumination beams; and
a controller communicatively coupled to the one or more detectors, the controller including one or more processors configured to execute program instructions when implementing the metrology recipe causing the one or more processors to determine overlay measurements along the one or more measurement directions based on one or more images of the overlay target received from the one or more detectors.

2. The overlay metrology system of claim 1, wherein each of the illumination beams within each of the one or more pairs of illumination beams are temporally and spatially coherent.

3. The overlay metrology system of claim 1, wherein the illumination beams within each of the one or more pairs of illumination beams are mutually temporally coherent to provide the sinusoidal interference pattern.

4. The overlay metrology system of claim 1, wherein the two or more grating structures on the overlay target comprise:
a first grating on a first layer of the sample; and
a second grating on a second layer of the sample, wherein the first grating and the second grating are in non-overlapping regions of the sample, wherein the first grating and the second grating have a common pitch, wherein a corresponding overlay measurement is based on a relative imaged shift between the first grating and the second grating.

5. The overlay metrology system of claim 4, wherein the overlay target comprises:
an advanced imaging metrology (AIM) target.

6. The overlay metrology system of claim 1, wherein the two or more grating structures on the overlay target comprise:
a first Moiré structure comprising:
a first grating with a first pitch on a first layer of the sample; and
a second grating with a second pitch on a second layer of the sample, wherein the first grating and the second grating are formed in a first overlapping region of the sample; and
a second Moiré structure comprising:
a third grating with the second pitch on the first layer of the sample; and
a fourth grating with the first pitch on the second layer of the sample, wherein the third grating and the fourth grating are formed in a second overlapping region of the sample.

7. The overlay metrology system of claim 6, wherein the overlay target comprises:
a robust advanced imaging metrology (r-AIM) target.

8. The overlay metrology system of claim 1, wherein the two or more grating structures comprise:
a first set of grating structures oriented along a first measurement direction; and
a second set of grating structures oriented along a second measurement direction, wherein the one or more pairs of illumination beams includes two pairs of illumination beams.

9. The overlay metrology system of claim 8, wherein the one or more illumination sources includes a first illumination source to generate a first pair of the two pairs of illumination beams and a second illumination source to generate a second pair of the two pairs of illumination beams.

10. The overlay metrology system of claim 8, wherein the one or more illumination sources include a single illumination source to generate the two pairs of illumination beams.

11. The overlay metrology system of claim 10, wherein the illumination beams in a first pair of the two pairs of illumination beams are temporally incoherent with respect to the illumination beams in a second pair of the two pairs of illumination beams.

12. The overlay metrology system of claim 10, wherein all of the illumination beams in the two pairs of illumination beams are mutually temporally coherent.

13. The overlay metrology system of claim 1, wherein the two or more grating structures are oriented along a single measurement direction, wherein the one or more pairs of illumination beams includes a single pair of illumination beams.

14. The overlay metrology system of claim 1, wherein the one or more pairs of illumination beams are incident on a common spot on the sample covering the overlay target.

15. The overlay metrology system of claim 1, wherein the one or more imaging optics includes an objective lens to collect light from the overlay target, wherein the one or more illumination optics directs the one or more pairs of illumination beams to the overlay target outside a numerical aperture (NA) of the objective lens.

16. The overlay metrology system of claim 1, wherein the one or more imaging optics includes an objective lens to collect light from the overlay target, wherein the one or more illumination optics directs the one or more pairs of illumination beams to the overlay target through the objective lens.

17. An overlay metrology method comprising:
    illuminating an overlay target on a sample with one or more pairs of illumination beams, wherein the illumination beams within a particular one of the one or more pairs of illumination beams are directed to the overlay target with common altitude incidence angles and symmetrically opposed azimuthal incidence angles along a selected illumination direction, wherein the overlay target in accordance with a metrology recipe includes two or more grating structures distributed along one or more measurement directions;
    imaging the overlay target onto one or more detectors, wherein an image of a particular one of the two or more grating structures includes a sinusoidal interference pattern generated exclusively with a single non-zero diffraction order of light from each of the illumination beams within a particular one of the one or more pairs of illumination beams; and
    determining overlay measurements along the one or more measurement directions based on one or more images of the overlay target received from the one or more detectors.

18. An overlay metrology system comprising:
    a controller communicatively coupled to one or more detectors, the controller including one or more processors configured to execute program instructions when implementing a metrology recipe causing the one or more processors to determine overlay measurements along one or more measurement directions based on one or more images of one or more overlay targets on a sample received from one or more detectors, wherein the one or more overlay targets in accordance with the metrology recipe include two or more grating structures distributed along the one or more measurement directions, wherein the one or more images of the one or more overlay targets are generated based on illumination with one or more pairs of illumination beams, wherein the illumination beams within a particular one of the one or more pairs of illumination beams are directed to the one or more overlay targets in accordance with the metrology recipe with common altitude incidence angles and symmetrically opposed azimuthal incidence angles along a selected illumination direction, wherein an image of a particular one of the two or more grating structures includes a sinusoidal interference pattern generated exclusively with a single non-zero diffraction order of light from each of the illumination beams within a particular one of the one or more pairs of illumination beams.

19. The overlay metrology system of claim 18, wherein each of the illumination beams within each of the one or more pairs of illumination beams are temporally and spatially coherent.

20. The overlay metrology system of claim 18, wherein the illumination beams within each of the one or more pairs of illumination beams are mutually temporally coherent to provide the sinusoidal interference pattern.

21. The overlay metrology system of claim 18, wherein the two or more grating structures on a particular one of the one or more overlay targets comprise:
    a first grating on a first layer of a sample; and
    a second grating a second layer of the sample, wherein the first grating and the second grating are in non-overlapping regions of the sample, wherein the first grating and the second grating have a common pitch, wherein a corresponding overlay measurement is based on a relative imaged shift between the first grating and the second grating.

22. The overlay metrology system of claim 21, wherein at least one of the one or more overlay targets comprise:
    an advanced imaging metrology (AIM) target.

23. The overlay metrology system of claim 18, wherein the two or more grating structures on at least one of the one or more overlay targets comprise:
    a first Moiré structure comprising:
        a first grating with a first pitch on a first layer of a sample; and
        a second grating with a second pitch on a second layer of the sample, wherein the first grating and the second grating are formed in a first overlapping region of the sample; and
    a second Moiré structure comprising:
        a third grating with the second pitch on the first layer of the sample; and
        a fourth grating with the first pitch on the second layer of the sample, wherein the third grating and the fourth grating are formed in a second overlapping region of the sample.

24. The overlay metrology system of claim 23, wherein at least one of the one or more overlay targets comprise:
    a robust advanced imaging metrology (r-AIM) target.

25. The overlay metrology system of claim 18, wherein the two or more grating structures comprise:
    a first set of grating structures oriented along a first measurement direction; and
    a second set of grating structures oriented along a second measurement direction, wherein the one or more pairs of illumination beams include two pairs of illumination beams.

26. The overlay metrology system of claim 25, wherein a first pair of the two pairs of illumination beams is formed with a first illumination source, wherein a second pair of the two pairs of illumination beams is formed with a second illumination source.

27. The overlay metrology system of claim 25, wherein the two pairs of illumination beams are formed from a single illumination source.

28. The overlay metrology system of claim 27, wherein the illumination beams in a first pair of the two pairs of illumination beams are temporally incoherent with respect to the illumination beams in a second pair of the two pairs of illumination beams.

29. The overlay metrology system of claim 27, wherein all of the illumination beams in the two pairs of illumination beams are mutually temporally coherent.

30. The overlay metrology system of claim 18, wherein the two or more grating structures are oriented along a single measurement direction, wherein the one or more pairs of illumination beams includes a single pair of illumination beams.

31. The overlay metrology system of claim 18, wherein the one or more pairs of illumination beams are incident on a common spot on the sample.

32. The overlay metrology system of claim 18, wherein an objective lens collects light from the one or more overlay targets, wherein the one or more pairs of illumination beams are directed by one or more illumination optics to the one or more overlay targets outside a numerical aperture (NA) of the objective lens in accordance with the metrology recipe.

33. The overlay metrology system of claim 18, wherein an objective lens collects light from the one or more overlay targets, wherein the one or more pairs of illumination beams are directed by one or more illumination optics to the one or more overlay targets through the objective lens in accordance with the metrology recipe.

\* \* \* \* \*